United States Patent [19]

Juza

[11] Patent Number: 5,032,954
[45] Date of Patent: Jul. 16, 1991

[54] ELECTRONIC COMPONENT HOUSING FOR USE IN HOSTILE ENVIRONMENTS

[75] Inventor: Augustin Juza, Thun, Switzerland
[73] Assignee: Ascom Hasler AG, Bern, Switzerland
[21] Appl. No.: 391,578
[22] PCT Filed: Nov. 2, 1988
[86] PCT No.: PCT/CH88/00201
 § 371 Date: Jul. 10, 1989
 § 102(e) Date: Jul. 10, 1989
[87] PCT Pub. No.: WO89/04559
 PCT Pub. Date: May 18, 1989

[30] Foreign Application Priority Data

Nov. 12, 1987 [CH] Switzerland .................. 04419/87

[51] Int. Cl.⁵ .............................................. H05K 7/14
[52] U.S. Cl. .................. 361/415; 361/394; 361/399; 361/412
[58] Field of Search .......... 361/384, 391, 393, 394, 361/395, 397, 399, 412, 415

[56] References Cited

U.S. PATENT DOCUMENTS 3,997,819 12/1976 Eggert et al. ................. 361/415
4,669,030 5/1987 Bannister ....................... 361/395
4,791,531 12/1988 Jessup ........................... 361/395

Primary Examiner—Leo P. Picard
Assistant Examiner—Donald A. Sparks
Attorney, Agent, or Firm—McAulay Fisher Nissen Goldberg & Kiel

[57] ABSTRACT

A housing for electronic components that includes a tubular, extruded aluminum, mid-section, a flat or plate-like front panel and a die-cast double-domed rear wall. Arranged in one of the domes of the rear wall is a printed circuit board with first female plugs. Fitting through the second dome, from the outside, are second female plugs, to which outwardly-leading cables are attached. Circuit boards with integrated electronic circuits slide into the housing and are secured laterally by guide grooves integral with the middle section of the housing. The boards, at their frontal edges, make contact through their male plugs with the appropriate ones of the female plugs. The boards are further secured by fitting into notches in a reinforcement rib between the two domes. A strip having three contact points is secured, if desired, to each circuit board for the purpose of reducing mechanical vibration. Each circuit board can be replaced individually. For this purpose, withdrawal arms are provided.

14 Claims, 3 Drawing Sheets

ELECTRONIC COMPONENT HOUSING FOR USE IN HOSTILE ENVIRONMENTS

BACKGROUND OF THE INVENTION

1. Field of the Invention

The present invention relates to a housing for electronic components suitable for use in hostile environments, and, more particularly, to such housing having connectors for electronic components and also having electronic components mounted therein.

2. Background of the Prior Art

Housings and switch boxes of various embodiments suitable for accommodating electronic circuits are generally known. Known in particular from patent EP 0 078 405 is a built-in plastic housing, whereby a cover and a floor portion are secured by special means to one or more annular middle sections. This method permits the size of the housing to be increased or decreased in stages.

Also generally known are service elements such as connecting elements (e.g. sockets or male plugs) which, being installed on the front and/or rear walls of such housings, enable the attachment of mating elements for the purpose of electrically connecting the housing to its environment. Such sockets and/or male plugs are connected in the housing through suitable wiring arrangements to normally parallel-arranged adjacent circuit boards comprising the electronic components of the overall electronic system.

SUMMARY OF THE INVENTION

An object of the present invention is to provide a stable and cost-effective housing for small electronic circuitry arrangements that is capable of operating in hostile environments while permitting an adequate transfer to the outside of heat generated by the electronic components. The proposed housing should be connected to its environment through a plurality of male plugs, sockets or female plugs.

In keeping with this object, there is provided in accordance with one aspect of the present invention a housing suitable for use in hostile environments and serving to mechanically secure and electrically connect a plurality of plug-in type circuit boards that bear integrated electronic circuits and that are arranged parallel to one another. The housing comprises a tubular, rectangular cross-sectioned, rigid middle section, a front panel and rear wall. The front panel and rear wall are detachably secured to the middle section covering respectively opposite open ends thereof. The rear wall comprises a rigid, die-cast section having two domes separated one from the other by a reinforcing rib having therein a plurality of spaced-apart guide notches. The guide notches serve to laterally or frontally secure circuit boards which can be located within the housing. One of the domes on the rear wall is adapted to accommodate a printed circuit board that bears a plurality of first male/female plugs facing the interior of the housing. A plurality of one part of second male/female plugs are detachably secured to the housing and projecting through the second dome of the rear wall into the housing. A cable of conductors extend from the second male/female plugs. Guide grooves opposite one another in the interior of the middle section are arranged slidably receiving opposite edges of respective ones of a plurality of plug-in type circuit boards that bear integrated electronic circuits and are arranged in spaced-apart, parallel relationship. The circuit boards have another part of male/female plugs for direct electrical contact with the corresponding first and/or second male/female plugs upon insertion into the housing.

For a better understanding of the present invention, reference is made to the following description and accompanying drawings while the scope of the invention will be pointed out in the appended claims.

BRIEF DESCRIPTION OF THE DRAWINGS

The invention is illustrated by way of example in the accompanying drawings wherein.

DESCRIPTION OF THE PREFERRED EMBODIMENTS

Figure 1:
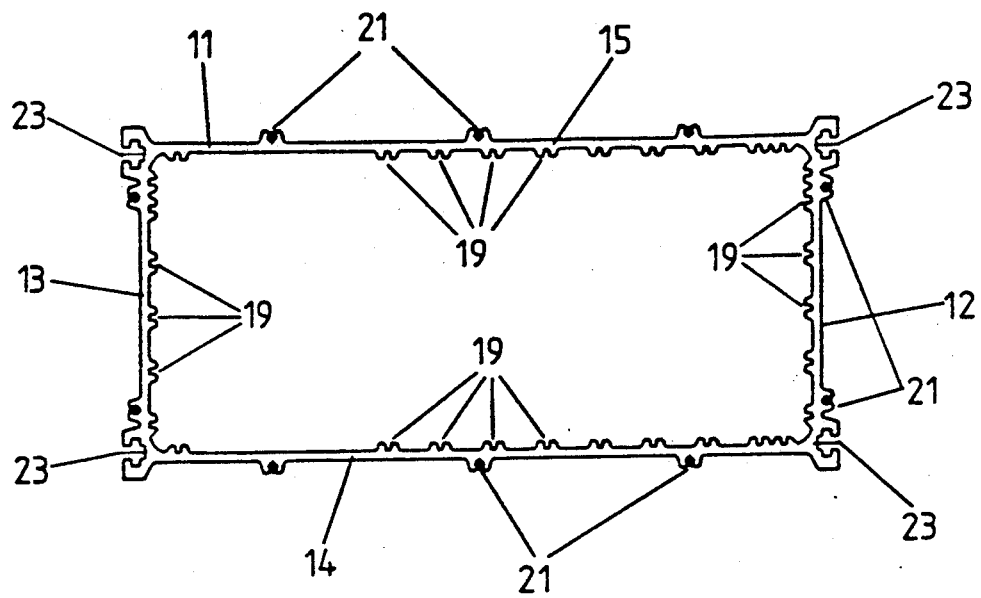
FIG. 1 is an end view of a middle section of the proposed housing.

In FIG. 1 there is illustrated a frontal end view of a middle section 11 of the housing 10 of the present invention. The midsection 11 is an open-ended, tube-like structure having opposite lateral walls 12, 13, a floor wall 14 and an upper side or top wall 15. The housing midsection 11 is an extruded, preferably metal, unitary section that is generally rectangular in cross-section. Arranged on the inside of each wall 12, 13, 14 and 15 of the housing are guide grooves 19', on the outer surfaces screw fastening grooves 21 are provided and at the corner, grooves 23 are provided. The grooves are defined effectively by closely adjacent ribs and thus may be considered as raised from the wall. Each of such grooves runs parallel to and along the length of the middle section 11 from one end to the other.

Figure 2:
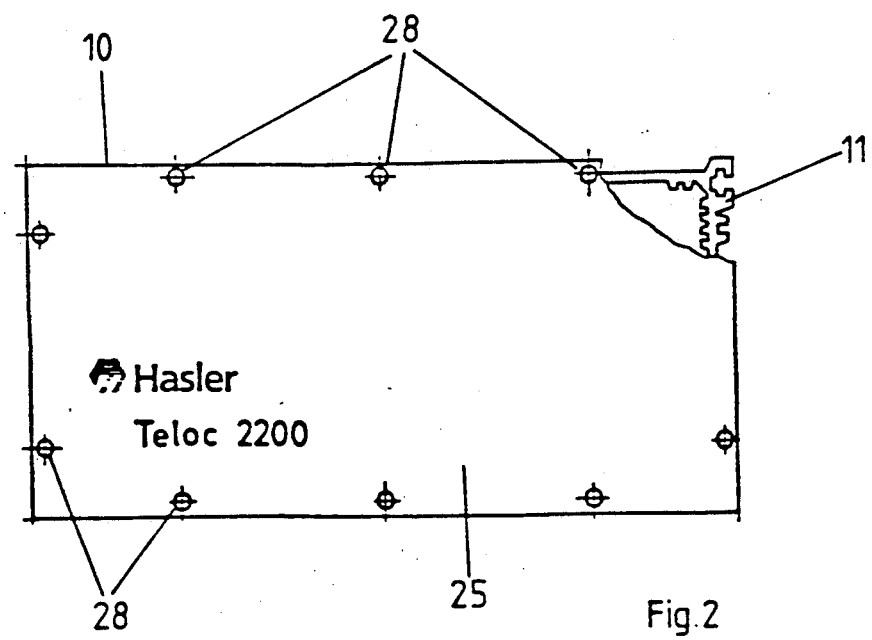
FIG. 2 is a front end view of an assembled housing of the present invention.

FIG. 2 is a frontal view of a fully-assembled electronics housing 10 featuring a rectangular, flat front panel 25 which, although comprising no service or display elements, is securely anchored to the front end of middle section 11 by means of a plurality, e.g. ten, self-tapping screws 28 that screw into the grooves 21 on middle section 11. Sealing between the end of the midsection and the frontal panel 25 can be improved by the installation of a sealing component, e.g. an annular sealing strip or gasket, between the components and, if desired, located in a groove in one of the components.

Figure 3:
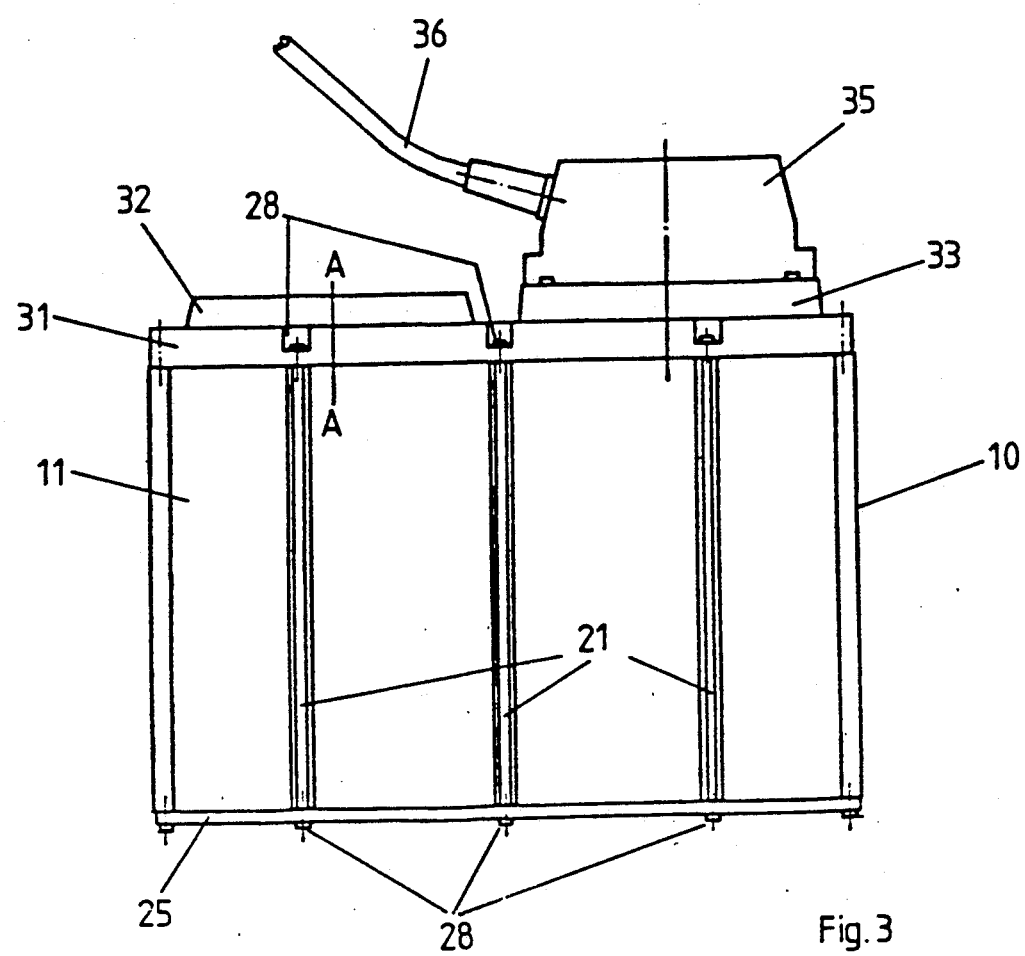
FIG. 3 is a top plan view of the assembled housing of the present invention.

FIG. 3 is a plan view of the housing 10. Flat front panel 25 is fastened as described above to the front open end of the middle section 11 by screws 28 that thread into grooves 21. A rear wall 31 is likewise fastened, closing the open rear opposite end of the midsection 11, by means of self-tapping screws 28 which are threaded into grooves 21. A sealing strip or gasket can, at the other end, be inserted between the wall and middle section 11. In place of self tapping screws, long bolts, if desired, can be used extending from one cover to the other so as to fasten both end covers 25 and 31 at the same time and clamp the midsection 11 therebetween.

Rear wall 31 features, on one half of its surface, a closed dome 32. Detachably secured (by screws, for example) to the other half of cover 31 is a support 33 or dome, which in turn, has a plurality of plugs 35, (only the uppermost one of which is visible) detachably secured (again by screws, for example) thereto. A cable 36 of conductors extends to the outside from each plug 35.

Figure 4:
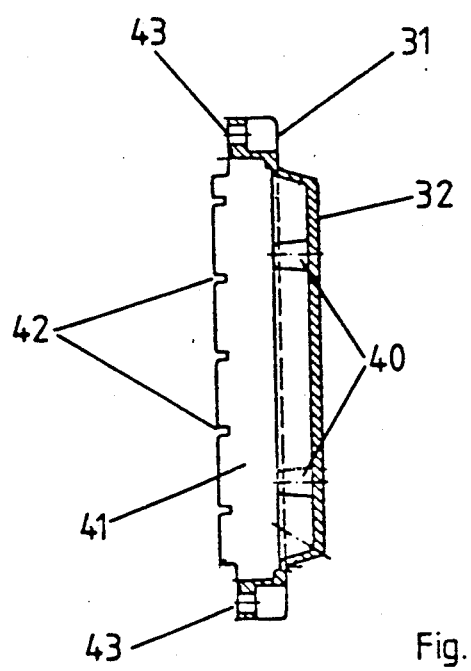
FIG. 4 is a sectional view through the rear wall only of the housing taken essentially along the line A—A of FIG. 3.

FIG. 4 is a section through rear wall 31 along line A-A of FIG. 3. Arranged on the inside of the dome 32 are eyes 40, to which can be attached (by screws by example) a (not illustrated) circuit board. Provided on the inner face is reinforcement ribs 41 which in turn has a plurality of guide notches 42. The rear wall 31 as seen from FIG. 4, has eye holes 43 for receiving the fastening screws 28.

Figure 5:
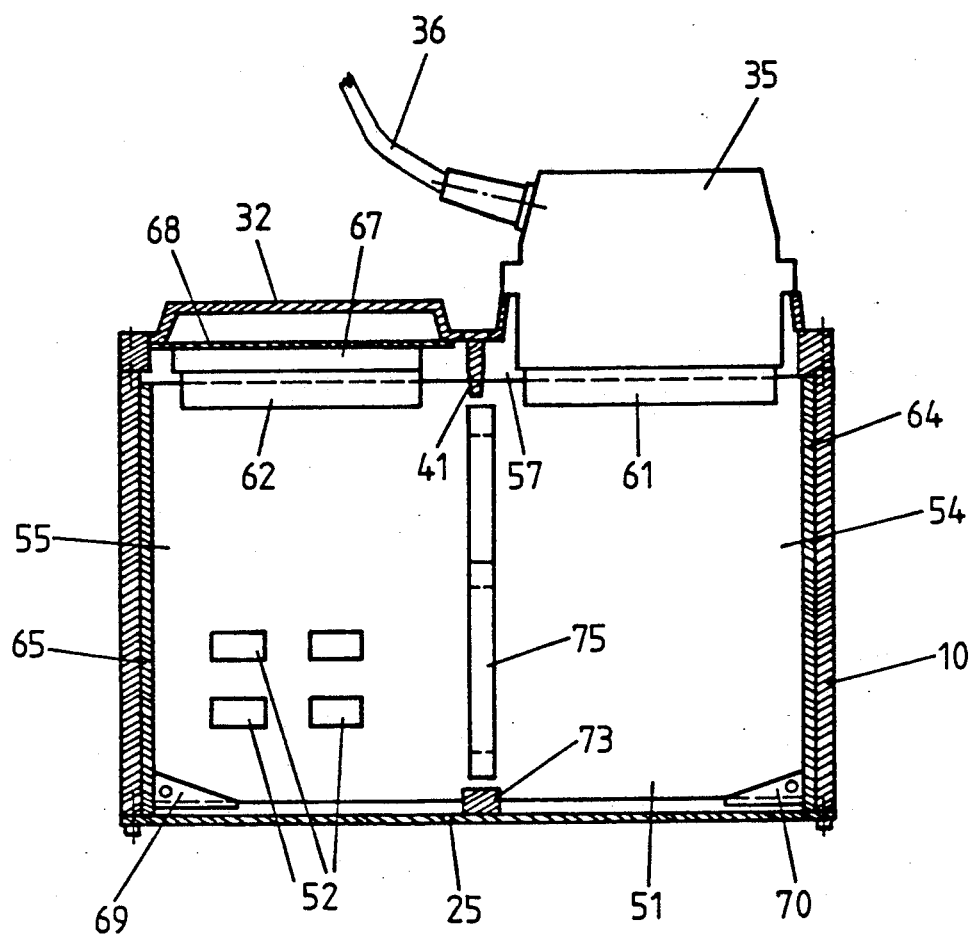
FIG. 5 is a cross-sectional view of the assembled housing.

FIG. 5 is a cut-away plan view of the interior of housing 10, wherein are arranged a plurality of horizontally disposed, vertically spaced-apart and parallel to one another, circuit boards 51 (e.g. five) containing electronic integrated circuits 52. Circuit boards (printed circuit boards) 51 have their opposite edges 54, 55 fitting into guide grooves, which can be either the grooves 19 as previously described forming part of middle piece 11, or grooves arranged in separate guide panels 64, 65. The frontal edges 57 of circuit boards 51 are situated in the guide notches 42 of reinforcement rib 41. Arranged on frontal borders 57 should ideally be two male plugs 61, 62 of which one, 61, connects directly by its pins to female plugs 35 which are, as already described, detachably secured (as by screws) onto housing 10. The other male plug, 62, connects to further female plugs 67, which are arranged on a wiring board 68. The wiring board 68 is securely fastened (with the aid of eyes 40, of FIG. 4) inside dome 32, and set orthogonally to circuit boards 51, and acts essentially to interconnect circuit boards 51.

When front panel 25 is removed, circuit boards 51 can be removed individually from housing 10. For this purpose, circuit boards 51 feature two swing or pivoted arms 69, 70 which, lying against the housing walls, serve to exert outwardpulling leverage on circuit boards 51. Each female plug 35 can, for testing or trial purposes, be individually removed or exchanged.

This arrangement fulfills the requirements and objects set forth above. The arrangement is quite compact and avoids unnecessary wiring. Middle section 11 is designed preferably as a section of an extrusion-molded aluminum tube. Rear wall 31 and support 33 are, preferably, of die-cast aluminum. This assembly forms, together with the flat front panel 25, a stable, cost-effective, fully metal housing that permits the effective transfer of heat from the electronic components to the outside while being suitable for employment in hostile environments such as, for example, inside railway locomotives.

The dimension of middle section 11 should ideally be such that circuit boards 51 of the double European standard size can be used in the horizontal direction, as described above, while circuit boards of the standard European format can be used in the vertical direction The corner grooves 23 can accommodate any desired number of screws for the purpose of screwing housing 10 to not-illustrated support elements. To this end, sliding or pushing nuts can be slid into such grooves 23. The finished assembly can be attached by the front panel to, e.g., a 19" frame, provided that front panel 25 is larger than the cross section of middle section 11 and possesses screw holes suitable for accommodating the 19" standard frame.

In another version, a strip 73, which is provided with notches, is screwed or otherwise secured onto front panel 25. The notches of strip 73, together with the guide notches 42 of reinforcement 41 of rear wall 31, act to guide circuit board 51 along its front 57 and outer edges. An E-shaped strip 75 screwed onto circuit boards 51 to extend from strip 73 to reinforcement 41, acts to sharply reduce vibrations in boards 51, which can be caused, for example, by mechanical shocks to housing 10.

While the foregoing description and drawings represent the preferred embodiments of the present invention, it will be obvious to those skilled in the art that various changes and modifications may be made therein without departing from the true spirit and scope of the present invention.

I claim:

1. A housing suitable for use in hostile environments and serving to mechanically secure and electrically connect a plurality of plug-in type circuit boards that bear integrated electronic circuits and that are arranged parallel to one another, said housing comprising: a tubular, rectangular crosssectioned, rigid middle section, a front panel and a rear wall, said front panel and rear wall being detachably secured to said middle section covering respectively opposite open ends thereof; said rear wall including a rigid die-cast section having first and second domes, said first dome having a first plurality of male/female plugs and said second dome having a second plurality of male/female plugs; said first and second domes being separated one from the other by a reinforcing rib having therein a plurality of spaced-apart guide notches, said guide notches serving to laterally or frontally secure a plurality of plug-in type circuit boards which can be located within said housing; said first dome on said rear wall being adapted to accommodate a printed circuit board having male/female plugs that mate with said first plurality of male/female plugs within the first dome; said second plurality of male/female plugs being detachably secured to the housing and projecting through said second dome of said rear wall into the housing, a cable of conductors extending from said second plurality of male/female plugs; guide grooves opposite one another on an interior surface of the middle section for slidably receiving opposite edges of respective ones of a plurality of plug-in type circuit boards that bear integrated electronic circuits and are arranged in spaced-apart, parallel relationship, said circuit boards having another part of male/female plugs for direct electrical contact with the corresponding first and/or second male/female plugs upon insertion into the housing.

2. A housing in accordance with claim 1, wherein said middle portion, rear wall and front panel are metal.

3. A housing according to claim 2 wherein said metal is aluminum, said middle portion being extruded.

4. A housing in accordance with claim 1, wherein said second plurality of male/female plugs are secured to said second dome in such a way that said second plurality of male/female plugs can, when said housing is closed, be removed individually from outside the housing.

5. A housing in accordance with claim 3, wherein said second plurality of male/female plug is fastened by means of screws.

6. A housing in accordance with claim 1, wherein said front panel includes a strip on its inside surface having grooves in which each circuit board is secured additionally on its fourth edge.

7. A housing in accordance with claims 1 or 6, wherein each circuit board bears an E-shaped strip serving to reduce mechanical vibrations, and extending, on a fully-assembled circuit board, essentially between said strip and said reinforcing rib.

8. A housing in accordance with claim 1, wherein arranged on the outside of middle section and as an integral part of said middle section, are corner grooves into which nuts can be slid for the purpose of fastening said housing to support elements by means of screws.

9. A housing including plug-in type circuit boards mounted therein suitable for use in hostile environments, said housing serving to mechanically secure and removably receive a plurality of plug-in type circuit boards that bear integrated electronic circuits and that are arranged parallel to one another, said housing comprising: an open ended, tubular-shaped, rigid middle section, a front panel detachably secured to said middle section and covering one open end thereof and a rear wall detachably secured to the middle section and covering the opposite open end thereof; said middle section being an extrusion-formed, generally rectangular in cross-section, rigid member having grooves in the walls thereof, means anchorable in selected ones of said grooves detachably to secure said front panel and rear wall to said middle section; a plurality of plug-in type circuit boards slidably fitted into grooves in the interior of said housing; said rear wall including a metallic die-cast section having two domes separated one from the other by a reinforcement rib having guide notches serving to receive a frontal edge of the respective circuit boards; a printed circuit board being arranged on the inside of one of said domes of said rear wall and having a first plurality of female plugs; a second plurality of female plugs projecting through said second dome of said rear wall, a cable extending from said second female plugs; each said circuit board being mechanically secured along three of its edges by guide grooves located opposite one another in said housing and a guide notch in said rear wall, said circuit boards having plugs making electrical contact with the corresponding first and/or second female plugs through one or more flat and/or second male plugs arranged upon said circuit boards.

10. An electronic component comprising: a housing that includes a unitary tubular middle section open at opposite ends thereof; a flat plate-like front panel detachably secured to said middle section and covering one of the open ends thereof; a double-domed rear wall detachably secured to said middle section and covering the other of the open ends thereof; a printed circuit board with first female plugs arranged in one of said domes of said rear wall; second female plugs, to which outwardly-leading cables are attached fitting through said second dome from the outside thereof and a plurality of circuit boards slidably mounted in opposite side walls interiorly of said middle section, said circuit boards further having their respective frontal edges projecting into notches in a reinforcement rib on said rear wall, said circuit boards having male plugs at their frontal edge mating with selected ones of said first and second female plugs.

11. An electronic component as defined in claim 10 further including a strip having three contact points, secured to each said circuit board for the purpose of reducing mechanical vibration.

12. An electronic component as defined in claim 10 wherein said housing middle portion, rear wall and front panel comprise aluminum.

13. An electronic component as defined in claim 10 including a strip on said front panel having grooves, in which each circuit board is secured additionally on its fourth edge.

14. An electronic component as defined in claim 10 including grooves on the inner and outer surfaces of said middle section extending from one to the other of said open ends.

* * * * *